(12) United States Patent
Buescher

(10) Patent No.: US 8,493,096 B1
(45) Date of Patent: Jul. 23, 2013

(54) METHOD FOR PERFORMING A TRI-STATE COMPARISON OF TWO INPUT SIGNALS IN A WINDOW COMPARATOR CIRCUIT, AND WINDOW COMPARATOR CIRCUIT FOR IMPLEMENTING THE METHOD

(75) Inventor: Kevin Scott Buescher, Colorado Springs, CO (US)

(73) Assignee: EM Microelectronic-Marin S.A., Marin (CH)

( * ) Notice: Subject to any disclaimer, the term of this patent is extended or adjusted under 35 U.S.C. 154(b) by 0 days.

(21) Appl. No.: 13/372,996

(22) Filed: Feb. 14, 2012

(51) Int. Cl.
*H03K 5/22* (2006.01)

(52) U.S. Cl.
USPC .................................. 327/63; 327/50; 327/70

(58) Field of Classification Search
USPC ............................... 327/50, 63, 70
See application file for complete search history.

(56) References Cited

U.S. PATENT DOCUMENTS

| | | | | |
|---|---|---|---|---|
| 5,426,386 A | * | 6/1995 | Matthews et al. | 327/63 |
| 5,973,515 A | * | 10/1999 | Marbot et al. | 327/65 |
| 6,445,218 B1 | * | 9/2002 | Lee | 327/65 |
| 7,592,845 B2 | * | 9/2009 | Kwon et al. | 327/70 |
| 8,248,108 B2 | * | 8/2012 | Santoro et al. | 327/63 |

* cited by examiner

*Primary Examiner* — Hai L Nguyen
(74) *Attorney, Agent, or Firm* — Oblon, Spivak, McClelland, Maier & Neustadt, L.L.P.

(57) ABSTRACT

A method performs a comparison of input signals in a window comparator circuit. In a first phase, input, ground and offset voltages are stored on capacitors. A comparison is performed between a first adapted input voltage and a second adapted input voltage added to an adapted offset voltage, to provide a first output signal. In a second phase, the voltages are stored on the capacitors in a different manner. A comparison is performed between the first adapted input voltage added to the adapted offset voltage and the second adapted input voltage, to provide a second output signal. Finally, a control of the state of the output signals is performed to determine if the comparison is in a low or high state if the output signals have a same low or high output level, or in an intermediate state if the output signals have a different output level.

12 Claims, 3 Drawing Sheets

METHOD FOR PERFORMING A TRI-STATE COMPARISON OF TWO INPUT SIGNALS IN A WINDOW COMPARATOR CIRCUIT, AND WINDOW COMPARATOR CIRCUIT FOR IMPLEMENTING THE METHOD

FIELD OF THE INVENTION

The present invention relates to a method for performing a tri-state comparison of two input signals in a window comparator circuit. In particular said method can be applied for processing motion of a light detection circuit of an optical pointing device.

The present invention concerns also the window comparator circuit for implementing the method for performing a tri-state comparison of two input signals. Said input signals can be signals from a pixel array, which picks up light reflected on a work surface.

BACKGROUND OF THE INVENTION

In the field of light detection in particular for a computer mouse with optical sensing device, it is actually necessary to improve the processing of the motion detection of said computer mouse on a work surface. The light reflected on the work surface has to be picked up by a pixel or photo-detector array in order to be processed in a motion detection processing circuit. A comparator array is placed between the pixel or photo-detector array and the motion detection processing circuit. Said comparator array is composed of several comparator units to compare successively several signals from the pixel or photo-detector array. With this motion detection processing circuit of the computer mouse, the varying intensity pattern of a portion of an illuminated work surface can be measured, and the information about the relative motion between the pixel or photo-detector array and the illuminated portion of the work surface can be extracted.

In a conventional computer mouse with detection of light reflected on a work surface, it can be envisaged to adapt an algorithm, which requires both hysteresis and tri-state detection levels. A window comparator circuit is used for tri-state detection levels. It is to be noted that a tri-state refers to three output states, for example one output state below a lower window voltage, one output state inside some window voltage limits, and one output state above an upper window voltage. For that it is generally not possible to conceive said window comparator circuit only with a simple comparator as usually in the light detection devices of the prior art. Furthermore due to the number of signals to be compared in the comparator array, it is not feasible to implement 2-bit A/D converters or two simple comparators, in order to perform a window function for a window comparator circuit. Additionally hysteresis is also required to prevent chatter at the boundaries.

We can cite the JP patent application No. 06-120784 A, which describes a window comparator circuit. Said window comparator circuit is composed of two comparators at the output of said circuit. Said window comparator circuit allows equalizing hysteresis characteristics of a dead zone width in the upper end and the lower end of said dead zone. For that it is used an operational amplifier combined with a voltage setting unit, a reference voltage source and a power source. Two signals from the voltage setting unit are respectively compared to a reference voltage in the two corresponding comparators. Given that two comparators are necessary to perform a comparison, said window comparator circuit is made with too many electronic components, which is a drawback. Furthermore it is difficult to match accurately the two comparators to well define a tri-state comparison function, which is another drawback.

SUMMARY OF THE INVENTION

It is thus a main object of the invention to provide a method for performing a tri-state comparison of two input signals in a window comparator circuit, which overcomes the drawbacks of the prior art and allows to be easily operated in a comparator array.

The invention therefore concerns a method for performing a tri-state comparison of two input signals in a window comparator circuit. Said method consists in a first phase:
- to store the voltage of a first input signal on a first capacitor, and a ground voltage on a second capacitor;
- to store an offset voltage on a third capacitor, and the voltage of a second input signal on a fourth capacitor;
- to compare in a comparator the first input voltage, which is adapted by a first factor, with the second input voltage, which is adapted by a second factor, added to the offset voltage, which is adapted by a third factor, to provide a first output signal, and wherein the method consists in a second phase:
- to store the voltage of the first input signal on the first capacitor, and the offset voltage on the second capacitor;
- to store the ground voltage on the third capacitor, and the voltage of the second input signal on the fourth capacitor;
- to compare in the comparator the first input voltage, which is adapted by the first factor, added to the offset voltage, which is adapted by a fourth factor, with the second input voltage, which is adapted by the second factor, to provide a second output signal, and
- to control the state of the first and second output signals to determine if the comparison of the first and second input signals is in a low state or in a high state if the first and second output signals have a same low or high output level, or in an intermediate state if the first and second output signals have a different output level.

Some particular steps of the method are defined in the dependent claims 2 to 6.

One advantage of the method for performing a tri-state comparison of two input signals in a window comparator circuit of the present invention, lies in the fact that a single output comparator is used two times successively in the window comparator circuit. This allows any residual offsets to be minimized and to save die array with a minimum number of electronic components to perform said tri-state comparison. Furthermore said method for performing the tri-state comparison in the window comparator circuit allows for a symmetrical window around a differential voltage at 0 V.

Advantageously, it is also easy to program a change in the window voltage without any complementary electronic components. A different offset voltage can be provided at the input of said window comparator circuit, or by adapting the capacitive ratio of capacitors on which are respectively stored each input voltage signal and offset voltage signal before comparing successively two adapted signals in an output comparator. Only one reference voltage can be used for defining the window function of said window comparator circuit. Said method easily fits into one phase of a two phase auto-zeroing comparator circuit.

Another object of the present invention concerns a window comparator circuit for implementing the method for performing a tri-state comparison of two input signals. The window comparator circuit includes a first capacitor to store a voltage of a first input signal, a second capacitor to store a ground voltage or an offset voltage, a third capacitor to store an offset voltage or a ground voltage, and a fourth capacitor to store a voltage of a second input signal, and a comparator to compare a first input voltage adapted by a first factor, with a second input voltage adapted by a second factor added to an offset voltage adapted by a third factor or to compare the first input voltage adapted by the first factor added to an offset voltage adapted by a fourth factor, with the second input voltage adapted by the second factor.

Some particular embodiments of the window comparator circuit are defined in the dependent claims 8 and 12.

BRIEF DESCRIPTION OF THE DRAWINGS

Other aspects, features and advantages of the present invention will be apparent upon reading the following detailed description of at least one non-limiting example and embodiment made with reference to the accompanying drawings, in which.

DETAILED DESCRIPTION OF THE INVENTION

The following description concerns specifically a window comparator circuit for implementing a method for performing a tri-state comparison between two input signals, in particular for an optical pointing device, such as a computer mouse. However it is to be noted that said window comparator circuit can be used also in other technical fields.

Figure 1:
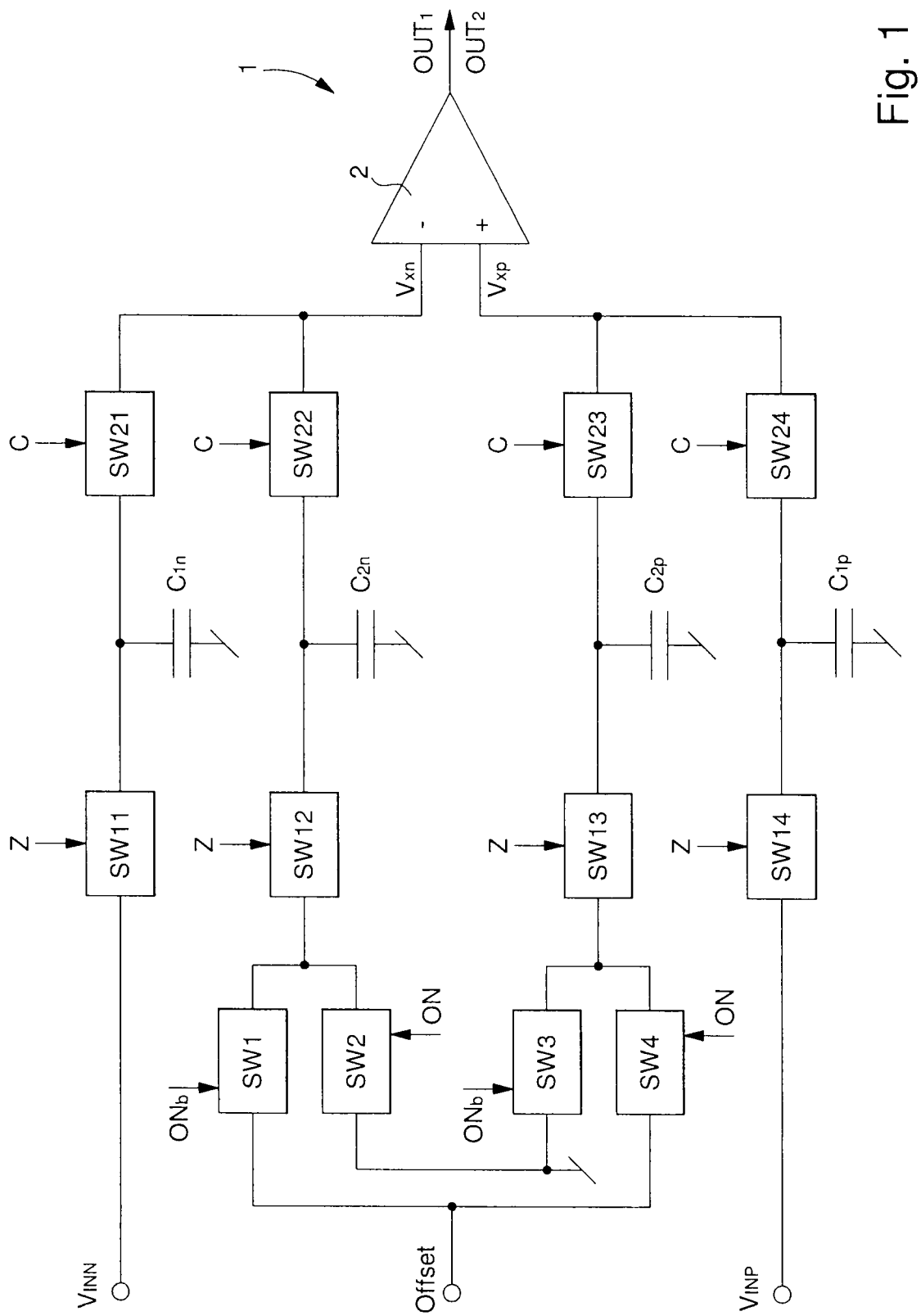
FIG. 1 shows a simplified view of an embodiment of a window comparator circuit for implementing the method for performing a tri-state comparison between two input signals of the present invention.

FIG. 1 shows a simplified view of a window comparator circuit 1 for implementing a method for performing a tri-state comparison between two input signals $V_{INN}$ and $V_{INP}$. Preferably said window comparator circuit 1 can be used in an optical computer mouse as explained hereafter briefly in reference to FIG. 4. In this case, several window comparator circuits 1 compose a comparator array of said optical computer mouse, where each window comparator circuit 1 is controlled by a motion detection processing circuit in order to compare two input signals $V_{INN}$ and $V_{INP}$ providing successively from a photo-detector array.

Compared to the technical prior art, a conventional signal comparator, which existed in previous computer mouse, is used for the conception of one part of the window comparator circuit 1 of the present invention. However this window comparator circuit is controlled for performing a comparison between two input signals $V_{INN}$ and $V_{INP}$ in time in order to implement a window function, and to generate three output levels at the output of said window comparator circuit. Said two input signals $V_{INN}$ and $V_{INP}$ have to be compared to determine if the first input signal $V_{INN}$ is less or greater than the second input signal $V_{INP}$ by more than X Volts, where X can be programmed as an offset voltage. So the window is defined as the inner region, where the first input signal $V_{INN}$ is within ±X Volts of the second input signal $V_{INP}$. To do that, the window voltage levels are simply capacitively added to one signal or the other signal prior to comparing said two adapted input signals. An adapted offset voltage signal is proportionally added to the second adapted input signal $V_{INP}$ in a first phase and to the first adapted input signal $V_{INN}$ in a second successive phase. On the one hand, it can be compared for example the first adapted input signal, which is a first adapted input voltage $V_{INN}$, added to an adapted offset voltage less than the second adapted input signal, which is a second adapted input voltage $V_{INP}$. On the other hand, it can be compared for example the second adapted input voltage $V_{INP}$ added to the adapted offset voltage less than the first adapted input voltage $V_{INN}$. The adaptation of each signal depends on a capacitive ratio as explained hereafter.

Figure 2:
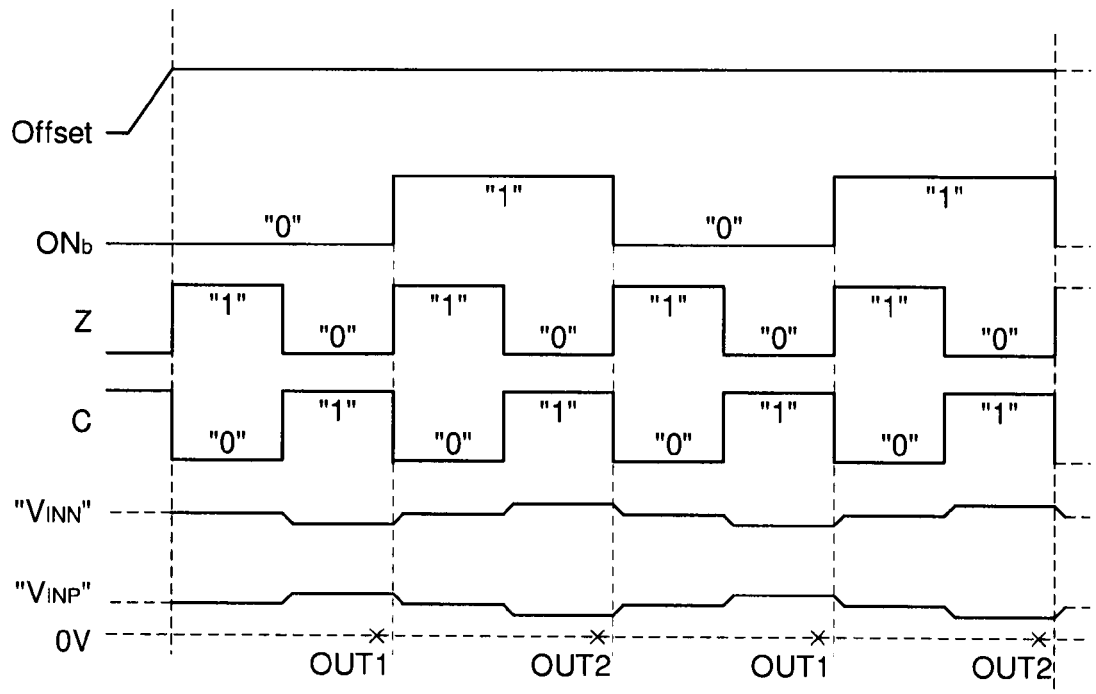
FIG. 2 shows a temporal diagram of signals through the window comparator circuit of the present invention, in which a first input voltage is sufficiently greater than a second input voltage.
Figure 3:
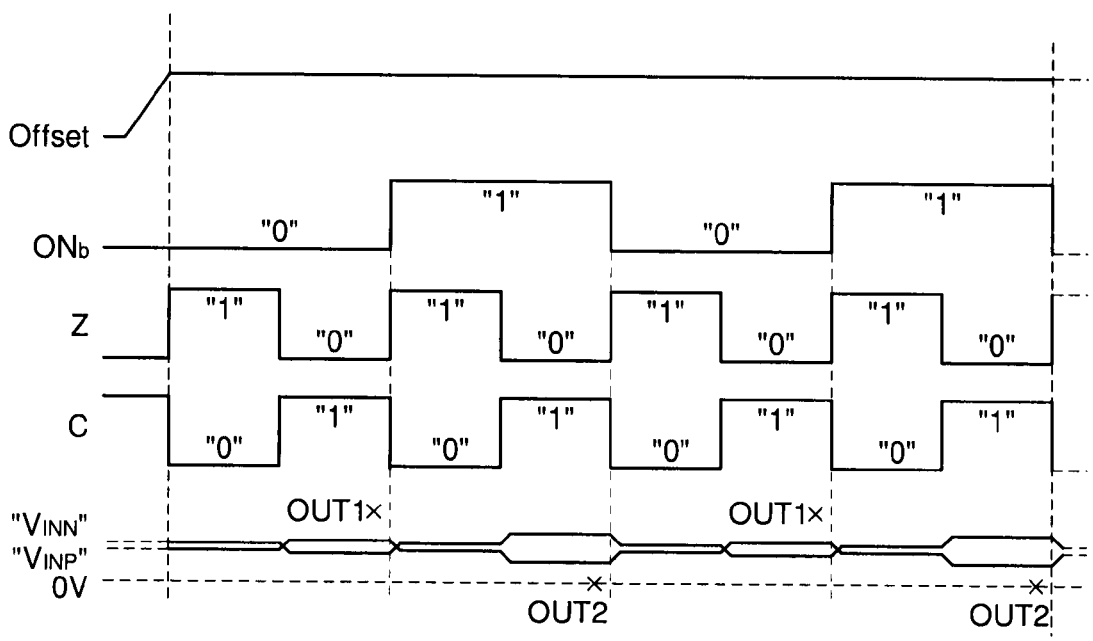
FIG. 3 shows a temporal diagram of signals through the window comparator circuit of the present invention, in which a first input voltage is close to a second input voltage.

The window comparator circuit 1 to implement the method for performing a tri-state comparison of the two input signals is now explained in more details in reference to FIGS. 1 to 3.

Said window comparator circuit 1 includes a first series of switches SW1, SW2, SW3, SW4, a second series of switches SW11, SW12, SW13, SW14, a third series of switches SW21, SW22, SW23, SW24, four capacitors $C_{1n}$, $C_{2n}$, $C_{1p}$, $C_{2p}$ and a single comparator 2. Each switch can be made with a transistor MOS, and for example with a NMOS transistor with the gate control by a specific control signal in order to open said switch through the connection of source and drain terminals, with a high voltage as a regulated voltage supplied to the gate terminal, and to close said switch with a ground voltage supplied to the gate terminal. Said capacitors can be made also with some MOS transistors, for example with PMOS transistors. In this case, said PMOS transistors have each source and drain terminals, and the n-well terminal connected to a high potential terminal of a power supply source or to a regulated voltage, whereas a gate terminal is used as the negative terminal of each capacitor. So said PMOS transistors are mounted in an inversion mode to make said capacitors, which is preferable to an accumulation mode.

It is to be noted that said capacitors $C_{1n}$, $C_{2n}$, $C_{1p}$, $C_{2p}$ can be made also with NMOS transistors. In this case, each NMOS transistor has source and drain terminals, and the p-well or bulk terminal connected to a ground voltage, whereas a gate terminal is used as the positive terminal of the capacitor as shown on FIG. 1.

First and fourth switches SW1, SW4 of the first series of switches receive at the input an offset determined voltage Offset, whereas second and third switches SW2, SW3 receive at the input a ground voltage. The first and third switches SW1, SW3 of the first series of switches are controlled by a negative offset control signal ONb, whereas the second and fourth switches SW2, SW4 of the first series of switches are controlled by a positive offset control signal ON, which is the reverse of the negative offset control signal ONb.

When the negative offset control signal ONb is in a "0" state, the positive offset control signal ON is in a "1" state in a first phase of the method. So in this first phase of the method, the ground voltage passes through the second closed switch SW2 of the first series of switches, whereas the offset voltage Offset passes through the fourth closed switch SW4 of the first series of switches. In the first phase, the first switch SW1 and the third switch SW3 are in an open state. When the negative offset control signal ONb is in a "1" state, the positive offset control signal ON is in a "0" state in a second phase of the method. So in this second phase of the method, the offset voltage Offset passes through the first closed switch SW1 of the first series of switches, whereas the ground voltage passes through the third closed switch SW3 of the first series of switches. In the second phase, the second switch SW2 and the fourth switch SW4 are in an open state.

The four switches SW11, SW12, SW13, SW14 of the second series of switches are each controlled by a same first control signal Z. Said first control signal Z has a frequency two times greater than the frequency of each offset control signal ON, ONb. When the first control signal Z is in a "1" state, all the switches are in a closed state, whereas when said first control signal Z is in a "0" state, all the switches are in an open state.

Said second series of switches includes a first switch SW11 to receive at the input the first input signal $V_{INN}$, which is preferably a first input voltage $V_{INN}$ providing for example from one selected pixel of the pixel or photo-detector array. When the first control signal Z is in the "1" state, said first input voltage $V_{INN}$ is stored or charged on a first capacitor $C_{1n}$. A second switch SW12 of the second series of switches receives at the input in the first phase, the ground voltage, and in the second phase, the offset voltage Offset. When the first control signal Z is in the "1" state, the ground voltage in the first phase or the offset voltage Offset in the second phase is stored or charged on a second capacitor $C_{2n}$. A third switch SW13 of the second series of switches receives at the input in the first phase, the offset voltage Offset, and in the second phase, the ground voltage. When the first control signal Z is in the "1" state, the offset voltage Offset in the first phase or the ground voltage in the second phase is stored or charged on a third capacitor $C_{2p}$. A fourth switch SW14 of the second series of switches receives at the input the second input voltage $V_{INP}$ providing for example from another selected pixel of the pixel or photo-detector array. When the first control signal Z is in the "1" state, said second input voltage $V_{INP}$ is stored or charged on a fourth capacitor $C_{1p}$.

The four switches SW21, SW22, SW23, SW24 of the third series of switches are each controlled by a same second control signal C. Said second control signal C has the same frequency like the first control signal Z, but the second control signal C is the reverse of the second control signal Z. When the second control signal C is in a "1" state, all the switches are in a closed state, whereas when said second control signal C is in a "0" state, all the switches are in an open state. The first switch SW21 of the third series of switches is connected between the first capacitor $C_{1n}$ and a negative input of a comparator 2. The second switch SW22 of the third series of switches is connected between the second capacitor $C_{2n}$ and the negative input of the comparator 2. The third switch SW23 of the third series of switches is connected between the third capacitor $C_{2p}$ and the positive input of the comparator 2. Finally the fourth switch SW23 of the third series of switches is connected between the fourth capacitor $C_{1p}$ and the positive input of the comparator 2.

When the second control signal C is in a "1" state, the first signal control Z is in a "0" state, and when the second control signal C is in a "0" state, the first signal control Z is in a "1" state. In principle the change of state of the second control signal C occurs with a slight delay after the change of state of the first control signal Z in order to perform a well defined comparison in the comparator 2. With the second control signal C in a "1" state, the first capacitor $C_{1n}$ and the second capacitor $C_{2n}$ are connected in parallel to the negative input of the comparator 2, and the third capacitor $C_{2p}$ and the fourth capacitor $C_{1p}$ are connected in parallel to the positive input of the comparator 2. In the first phase of the method, the first adapted voltage $Vx_n$ at the negative input of the comparator 2 corresponds to the first input voltage, which is capacitively adapted by the factor $N/(N+M)$. So in the first phase of the method, the first adapted voltage is defined by $V_{xn}=V_{INN}\cdot(C_{1n}/(C_{1n}+C_{2n}))$, where N corresponds to the capacitive value $C_{1n}$ and M corresponds to the capacitive value $C_{2n}$. In the first phase, the second adapted voltage $V_{xp}$ corresponds to the second input voltage, which is capacitively adapted by the factor $N'/(N'+M')$, added to the offset voltage, which is capacitively adapted by the factor $M'/(N'+M')$. So in the first phase of the method, the second adapted voltage is defined by $V_{xp}=V_{INP}\cdot(C_{1p}/(C_{1p}+C_{2p}))+\text{Offset}\cdot(C_{2p}/(C_{1p}+C_{2p}))$, where N' corresponds to the capacitive value $C_{1p}$, whereas M' corresponds to the capacitive value $C_{2p}$.

In the second phase of the method, the first adapted voltage $V_{xn}$ at the negative input of the comparator 2 corresponds to the first input voltage $V_{INN}$, which is capacitively adapted by the factor $N/(N+M)$, added to the offset voltage, which is capacitively adapted by the factor $M/(N+M)$. The second adapted voltage at the positive input of the comparator 2 corresponds to the second input voltage $V_{INP}$, which is capacitively adapted by the factor $N'/(N'+M')$. Said first adapted voltage is defined by $V_{xn}=V_{INN}\cdot(C_{1n}/(C_{1n}+C_{2n}))+\text{Offset}\cdot(C_{2n}/(C_{1n}+C_{2n}))$, whereas the second adapted voltage is defined by $V_{xp}=V_{INP}\cdot(C_{1p}/(C_{1p}+C_{2p}))$.

Preferably to have symmetry on the two paths of comparison, the capacitive value of the first capacitor $C_{1n}$ corresponds to the capacitive value of the fourth capacitor $C_{1p}$, whereas the capacitive value of the second capacitor $C_{2n}$ corresponds to the capacitive value of the third capacitor $C_{2p}$. So the capacitive factor $N/(N+M)$ corresponds to the capacitive factor $N'/(N'+M')$, and the capacitive factor $M/(N+M)$ corresponds to the capacitive factor $M'/(N'+M')$. The second and third capacitors $C_{2n}$ and $C_{2p}$ can be each considered as a unit capacitor made for example with a PMOS transistor, which is connected in a preferred inversion mode or in an accumulation mode. The first and fourth capacitors $C_{1n}$ and $C_{1p}$ can be made each with 9 unit capacitors, to have a capacitive value corresponding to 9 times the capacitive value of the second or third capacitors $C_{2n}$ and $C_{2p}$. With these capacitive values, said capacitors can be easily matched in an integrated circuit. The four capacitors $C_{1n}$, $C_{2n}$, $C_{2p}$, $C_{1p}$ can be configured as 20 unit capacitors placed under a rectangular shape with seven unit capacitors for the length and three unit capacitors for the width.

With this capacitor arrangement and the second control signal C in "1" state, the offset voltage Offset is multiplied by the factor $1/10$ to be added to the second or first input voltage $V_{INP}$ or $V_{INN}$, which is multiplied by the factor $9/10$, in the first or second phase of the method. With the addition of the adapted offset voltage for the first and second phases of the method, it is defined a tri-state comparison in the window comparator circuit 1.

In a first phase of the method, a first output signal $OUT_1$ is provided at the output of the comparator 2, which is stored for example in memory by means of a processing circuit. In a second phase of the method, a second output signal $OUT_2$ is provided at the output of the comparator 2. If the first input voltage $V_{INN}$ is greater than the second input voltage $V_{INP}$ by more than X Volts, the output signals $OUT_1$ and $OUT_2$ are at a "0" state, i.e. at 0 V. If the second input voltage $V_{INP}$ is greater than the first input voltage $V_{INN}$ by more than X Volts, the output signals $OUT_1$ and $OUT_2$ are at a "1" state, i.e. at a high level near to a regulated voltage. If the first input voltage $V_{INN}$ is within $\pm X$ Volts of the second input signal $V_{INP}$, the first output signal $OUT_1$ can be at 0 V or at high level, whereas the second output signal $OUT_2$ can be the reverse of the first output signal $OUT_1$, at high level or at 0 V. So the motion detection processing circuit can easily consider the three levels of said window comparator circuit 1 in order to improve the detection of the motion of the computer mouse on a work surface.

To define the window function of said window comparator circuit 1, the X value corresponds to (M/N)·Offset supplied at the input of said window comparator circuit 1. Said offset voltage Offset can be programmed via a 4-bit bus from the processing circuit between 0 and 200 mV or preferably between 0 and 75 mV with an LSB value of 5 mV. In this case, with a maximum offset voltage at 75 mV, the first input voltage $V_{INN}$ has to be greater or lower, than the second input voltage $V_{INP}$ by more or less than approximately 8.5 mV to obtain the two output signals $OUT_1$ and $OUT_2$ at a low level or a high level. The voltage range of each input voltage is between 0 and 500 mV and often close to 50 mV or 100 mV depending on the light reflected on a work surface and picked up by the pixels of the photo-detector array.

FIG. 2 schematically shows a temporal diagram of some signals through the window comparator circuit, in which a first input voltage $V_{INN}$ is sufficiently greater than a second input voltage $V_{INP}$ by more than (M/N)·Offset. In a first phase of the method, the negative offset control signal ONb is in a "0" state, whereas in a second phase of the method, the negative signal ONb is a "1" state. The positive offset control signal ON not shown is exactly the reverse of the negative offset control signal ONb. The duration for each state of said negative offset control signal ONb can be defined close to 2.5 μs for a frequency of said negative control signal ONb at 200 kHz.

The first control signal Z and the second control signal C, which is the reverse of the first control signal Z, have duration of each state corresponding to the half of the duration of the negative offset control signal, at 1.25 μs. If the frequency of the negative control signal ONb is at 200 kHz, the frequency of the first and second control signals Z and C is at 400 kHz. It can be envisaged to reduce said duration of each state for the first control signal Z and the second control signal C until a minimum of 500 ns.

In the case of the first input voltage $V_{INN}$ greater than the second input voltage $V_{INP}$ by more than (M/N)·Offset, the first output signal $OUT_1$ and the second output signal $OUT_2$ are each at 0 V. We can see on FIG. 2 for the first phase of the method and when the second control signal C in a "1" state that the first adapted voltage based on the first input voltage $V_{INN}$ is slightly reduced, whereas the second adapted voltage based on the second input voltage $V_{INP}$ is slightly increased, but lower than the first adapted signal. In the second phase, the first adapted voltage is slightly increased, whereas the second adapted voltage is slightly reduced. So the two output signals $OUT_1$ and $OUT_2$ are effectively at 0 V to define the first level of the window comparator circuit.

If the second input voltage $V_{INP}$ is greater than the first input voltage $V_{INN}$ by more than (M/N)·Offset, the two output signals $OUT_1$ and $OUT_2$ are in this case at a high level in the "1" state. So this defines the third level of the window comparator circuit, but not shown in FIGS. 2 and 3.

FIG. 3 schematically shows a temporal diagram of some signals through the window comparator circuit, in which a first input voltage $V_{INN}$ is within ±(M/N)·Offset with respect to the second input voltage $V_{INP}$. In this case, a second or intermediate level of the window comparator circuit is shown.

Specifically we can note that in the first phase of the method, the second adapted voltage comes higher than the first adapted voltage when the second control signal C is in a "1" state. So the first output signal $OUT_1$ is at a high level in the "1" state in said first phase. However in the second phase of the method, the first adapted voltage is higher than the second adapted voltage when the second control signal C is in a "1" state. So the second output signal $OUT_2$ is at 0V. The processing circuit can interpret the two different output signals $OUT_1$ and $OUT_2$ for considering the second or intermediate level of window comparator circuit.

Figure 4:
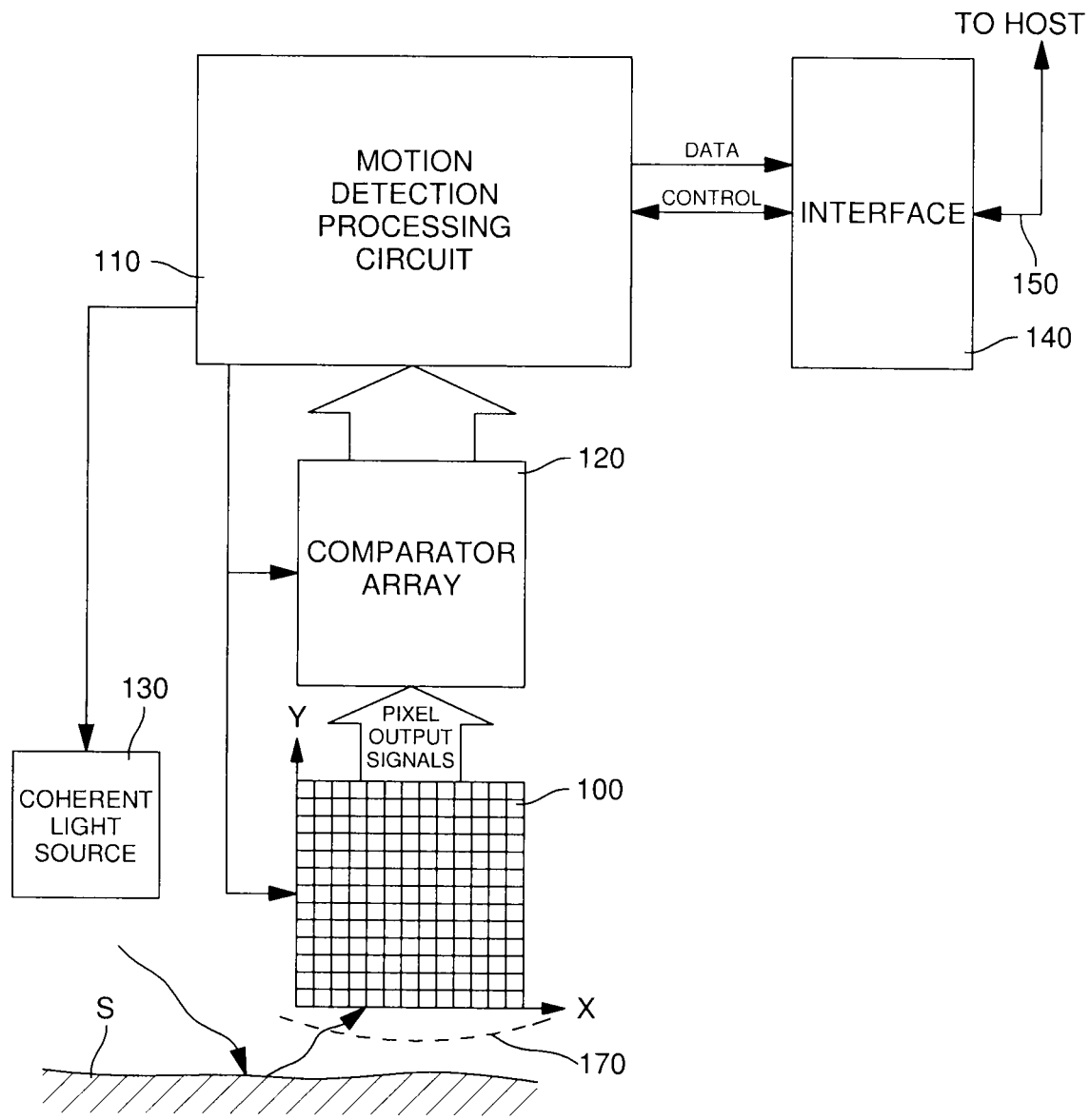
FIG. 4 shows in a simplified manner, the electronic components of a light detection circuit of an optical pointing device, which includes several window comparator circuits of the present invention.

FIG. 4 shows a generalized schematic block diagram of an optical pointing device as defined also in the patent application US 2007/0290121 A1. It generally includes at least one coherent light source 130, such as a laser illumination source, which produces radiation at a determined flash rate on a portion of a work surface S, and a pixel or photo-detector array 100 having a plurality of pixels, to pick up the light reflected on said work surface S. It can be used also a non-coherent light source, such as a LED source, so that the method can work with either coherent or non-coherent light. This photo-detector array 100 is coupled to processing means 110, such as a motion detection processing circuit, for processing the signals outputted by the photo-detector array 100.

A comparator array 120 is interposed between processing means 110 and pixel array 100. Said comparator array 120 includes a plurality of window comparator circuits each for comparing the light intensity of a first pixel of array 100 with the light intensity of a second pixel of array 100 and for outputting a comparison signal in one of the three states defined by the window comparator circuit of the present invention, and also resulting motion feature conditions.

The coherent or non-coherent light source 130 of the optical pointing device, produces radiation at a determined flash rate, that impinges with a determined gradient on a portion of a work surface S. Said work surface S may be a planar or non-planar surface, such as a surface over which the pointing device is moved (as in the case of an optical mouse), the surface of a ball (as in the case of an optical trackball) or any other suitable surface that may provide an appropriate speckled intensity pattern for detection by photo-detector array 100.

Processing means 110 is further adapted to communicate in a bi-directional manner with an interface 140 that communicates in turn with a host system (not illustrated) over a bus 150. Cursor control signals (and eventually other signals related to the optical pointing device) are supplied to the host system over bus 150. Processing means 110 may also receive information, such as configuration signals, over bus 150 from the host system.

Processing means 110 is essentially designed to intermittently sample the pixel outputs of photo-detector array 100 in accordance with a defined sequence. The information of two successive samples or speckled images is compared and a relative motion measurement is extracted by processing means 110. The adequate cursor control signals are then derived from the relative motion measurement and transmitted to the host system via line interface 140.

However, the light intensity pattern detected by photo-detector device 100 forms a speckled image which can generate too many motion features which render motion detection less reliable. With coherent light or with non-coherent light for the speckled image, it is just contrast variations. For that purpose, processing means 110 can be provided with a very simple selecting factor which promotes detection of one type of motion feature rather than the other type.

On the basis of the description just given, numerous variants of the method for performing a tri-state comparison of two input signals in a window comparator circuit, and said window comparator circuit for implementing the method can be designed by a person skilled in the art without departing from the scope of the invention as defined in the claims. The capacitive factor for adaptation of the first or second input voltage and for adaptation of the offset voltage can be programmed to different values preferably between ½ and ¹⁄₂₀. The first series of switches can be replaced by a multiplexer with two inputs and two outputs and controlled by a 2-bit control signal.

What is claimed is:

1. A method for performing a tri-state comparison of two input signals in a window comparator circuit, wherein the method consists in a first phase:
  to store the voltage of a first input signal on a first capacitor, and a ground voltage on a second capacitor;
  to store an offset voltage on a third capacitor, and the voltage of a second input signal on a fourth capacitor;
  to compare in a comparator the first input voltage, which is adapted by a first factor, with the second input voltage, which is adapted by a second factor, added to the offset voltage, which is adapted by a third factor, to provide a first output signal, and
wherein the method consists in a second phase:
  to store the voltage of the first input signal on the first capacitor, and the offset voltage on the second capacitor;
  to store the ground voltage on the third capacitor, and the voltage of the second input signal on the fourth capacitor;
  to compare in the comparator the first input voltage, which is adapted by the first factor, added to the offset voltage, which is adapted by a fourth factor, with the second input voltage, which is adapted by the second factor, to provide a second output signal, and
  to control the state of the first and second output signals to determine if the comparison of the first and second input signals is in a low state or in a high state if the first and second output signals have a same low or high output level, or in an intermediate state if the first and second output signals have a different output level.

2. The method according to claim 1, wherein in the first phase of the method for the comparison in the comparator, the first input voltage is adapted by the first factor defined by the ratio N/(N+M), where N is the capacitive value of the first capacitor, and M is the capacitive value of the second capacitor, wherein in the first phase of the method for the comparison in the comparator, the second input voltage is adapted by the second factor defined by the ratio N'/(N'+M'), where N' is the capacitive value of the fourth capacitor, and M' is the capacitive value of the third capacitor, and the offset voltage is adapted by the third factor defined by M'/(N'+M'), wherein in the second phase of the method for the comparison in the comparator, the first input voltage is adapted by the first factor defined by the ratio N/(N+M), and the offset voltage is adapted by the fourth factor defined by the ratio M/(N+M), and wherein in the second phase of the method for the comparison in the comparator, the second input voltage is adapted by the second factor defined by the ratio N'/(N'+M').

3. The method according to claim 2, wherein in the first phase and the second phase of the method, the first factor for adapting the first input voltage is equal to the second factor for adapting the second input voltage, and the third factor for adapting the offset voltage is equal to the fourth factor for adapting the offset voltage.

4. The method according to claim 3, wherein in the first and second phases of the method, the first and second input voltages are adapted by the first and second factors, which are 9 times greater than the third and fourth factors for adapting the offset voltage.

5. The method according to claim 1, for which the window comparator circuit includes a first series of four switches, a first switch and a fourth switch receiving at the input the offset voltage, and a second switch and a third switch receiving at the input the ground voltage, the first and third switches being controlled by a negative offset control signal, whereas the second and fourth switches are controlled by a positive offset control signal, which is the reverse of the negative offset control signal, wherein in the first phase of the method, the second switch and the fourth switch are closed by the positive offset control signal in order to store the ground voltage on the second capacitor, and the offset voltage on the third capacitor, and wherein in the second phase of the method, the first switch and the third switch are closed by the negative offset control signal in order to store the offset voltage on the second capacitor, and the ground voltage on the third capacitor.

6. The method according to claim 5, for which the window comparator circuit includes a second series of four switches, which are each controlled by a first control signal, a first switch of the second series receiving at the input a first input signal, a second switch of the second series receiving the ground voltage in the first phase of the method and the offset voltage in the second phase of the method, a third switch of the second series receiving the offset voltage in the first phase of the method and the ground voltage in the second phase of the method, and a fourth switch of the second series receiving the second input signal, for which the window comparator circuit includes a third series of four switches, which are each controlled by a second control signal, which is the reverse of the first control signal, a first switch of the third series being connected between the first capacitor and a first input of the comparator, a second switch of the third series being connected between the second capacitor and the first input of the comparator, a third switch of the third series being connected between the third capacitor and the second input of the comparator, and a fourth switch of the third series being connected between the fourth capacitor and the second input of the comparator,
  wherein in the first phase of the method, the switches of the second series of switches are each closed first of all by the first control signal in order to store the first input voltage on the first capacitor, the ground voltage on the second capacitor, the offset voltage on the third capacitor and the second input voltage, on the fourth capacitor,
  wherein in the first phase of the method, the switches of the third series of switches are each closed by the second control signal, whereas all the switches of the second series of switches are open by the first control signal, in order to compare the first input voltage adapted by the first factor with the second input voltage adapted by the second factor added to the offset voltage adapted by the third factor,
  wherein in the second phase of the method, the switches of the second series of switches are each closed first of all by the first control signal in order to store the first input voltage on the first capacitor, the offset voltage on the second capacitor, the ground voltage on the third capacitor and the second input voltage, on the fourth capacitor, and
  wherein in the second phase of the method, the switches of the third series of switches are each closed by the second control signal, whereas all the switches of the second series of switches are open by the first control signal, in order to compare the first input voltage adapted by the first factor added to the offset voltage adapted by the fourth factor, with the second input voltage adapted by the second factor.

7. A window comparator circuit for implementing the method for performing a tri-state comparison of two inputs signals according to claim 1, wherein said window comparator circuit includes a first capacitor to store a voltage of a first input signal, a second capacitor to store a ground voltage or an offset voltage, a third capacitor to store an offset voltage or a ground voltage, and a fourth capacitor to store a voltage of a second input signal, and a comparator to compare a first input voltage adapted by a first factor, with a second input voltage adapted by a second factor added to an offset voltage adapted by a third factor or to compare the first input voltage adapted by the first factor added to an offset voltage adapted by a fourth factor, with the second input voltage adapted by the second factor.

8. The window comparator circuit according to claim 7, wherein said window comparator circuit includes a first series of four switches, a first switch and a fourth switch being intended to receive at the input the offset voltage, and a second switch and a third switch being intended to receive at the input the ground voltage, the first and third switches being controlled by a negative offset control signal, whereas the second and fourth switches are controlled by a positive offset control signal, which is the reverse of the negative offset control signal.

9. The window comparator circuit according to claim 8, wherein said window comparator circuit includes a second series of four switches, which are each controlled by a first control signal, a first switch of the second series being intended to receive at the input a first input signal, a second switch of the second series being intended to receive the ground voltage or the offset voltage, a third switch of the second series being intended to receive the offset voltage or the ground voltage, and a fourth switch of the second series being intended to receive the second input signal, and wherein the window comparator circuit includes a third series of four switches, which are each controlled by a second control signal, which is the reverse of the first control signal, a first switch of the third series being connected between the first capacitor and a first input of the comparator, a second switch of the third series being connected between the second capacitor and the first input of the comparator, a third switch of the third series being connected between the third capacitor and the second input of the comparator, and a fourth switch of the third series being connected between the fourth capacitor and the second input of the comparator.

10. The window comparator circuit according to claim 9, wherein each capacitor is made with a PMOS transistor having source and drain terminals intended to be connected to a high potential of a power supply source or to a regulated voltage, and a gate terminal used as a negative terminal of said capacitor in order to store the first input voltage, the second input voltage, the offset voltage or the ground voltage, wherein the switches of the first, second and third series of switches are each made with a NMOS transistor with a gate terminal intended to receive a respective control signal to close or to open each switch.

11. The window comparator circuit according to claim 7, wherein the first and fourth capacitors have a capacitive value greater than the capacitive value of the second and third capacitors.

12. The window comparator circuit according to claim 7, wherein the second and third capacitors are each a unit capacitor, and wherein the first and fourth capacitors are made of several unit capacitors in order to match the capacitor arrangement in an integrated circuit.

\* \* \* \* \*